(12) United States Patent
Ishibashi

(10) Patent No.: US 8,932,407 B2
(45) Date of Patent: Jan. 13, 2015

(54) SUBSTRATE CLEANING METHOD

(71) Applicant: Ebara Corporation, Tokyo (JP)

(72) Inventor: Tomoatsu Ishibashi, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 13/894,331

(22) Filed: May 14, 2013

(65) Prior Publication Data

US 2013/0312790 A1 Nov. 28, 2013

(30) Foreign Application Priority Data

May 23, 2012 (JP) ................................. 2012-117344
Mar. 4, 2013 (JP) ................................. 2013-041494

(51) Int. Cl.
*B08B 7/04* (2006.01)
*H01L 21/02* (2006.01)
*B08B 1/04* (2006.01)

(52) U.S. Cl.
CPC ...... *H01L 21/02041* (2013.01); *H01L 21/0265* (2013.01); *H01L 21/02074* (2013.01); *H01L 21/02096* (2013.01); *B08B 1/04* (2013.01); *Y10S 134/902* (2013.01)
USPC ........ 134/6; 134/24; 134/32; 134/33; 134/34; 134/42; 134/902; 15/77; 15/88.3; 15/102

(58) Field of Classification Search
CPC ............ B08B 1/00; B08B 1/002; B08B 1/04; B08B 3/00; B08B 3/02; B08B 3/04; H01L 21/00; H01L 21/02041
USPC ......... 15/77, 88.3, 102; 134/6, 24, 32, 33, 34, 134/42, 902

See application file for complete search history.

(56) References Cited

U.S. PATENT DOCUMENTS

| | | | | |
|---|---|---|---|---|
| 5,351,360 | A * | 10/1994 | Suzuki et al. | 15/302 |
| 6,733,596 | B1 * | 5/2004 | Mikhaylichenko et al. | 134/6 |
| 2006/0016029 | A1 * | 1/2006 | Mikhaylichenko et al. | 15/102 |
| 2008/0105277 | A1 * | 5/2008 | Boyd et al. | 134/6 |

FOREIGN PATENT DOCUMENTS

| | | |
|---|---|---|
| JP | 09-069502 | 3/1997 |
| JP | 2003-077876 | 3/2003 |
| JP | 2010-074191 | 4/2010 |
| JP | 2010-278103 | 12/2010 |

* cited by examiner

*Primary Examiner* — Bibi Carrillo
(74) *Attorney, Agent, or Firm* — Baker & Hostetler LLP

(57) ABSTRACT

A substrate cleaning method is used for performing scrub cleaning of a surface of a substrate. The substrate cleaning method includes rotating a roll cleaning member and a substrate respectively in one direction while keeping the roll cleaning member in contact with the substrate in a cleaning area, and supplying a cleaning liquid to a surface of the substrate to scrub-clean the surface of the substrate in the presence of the cleaning liquid in the cleaning area. The cleaning liquid is supplied initially to an inverse-direction cleaning area of the cleaning area where the relative rotational velocity between the roll cleaning member and the substrate is relatively high, and thereafter to a forward-direction cleaning area of the cleaning area where the relative rotational velocity between the roll cleaning member and the substrate is relatively low while the substrate makes one revolution on a central axis thereof.

4 Claims, 6 Drawing Sheets

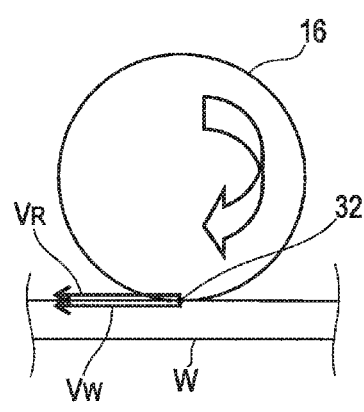
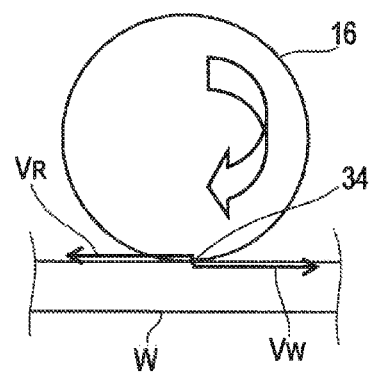

SUBSTRATE CLEANING METHOD

CROSS REFERENCE TO RELATED APPLICATIONS

This document claims priorities to Japanese Patent Application No. 2012-117344, filed May 23, 2012, and Japanese Patent Application No. 2013-041494, filed Mar. 4, 2013, the entire contents of which are hereby incorporated by reference.

BACKGROUND OF THE INVENTION

1. Field of the Invention

The present invention relates to a substrate cleaning method for performing scrub cleaning of a surface of a substrate, such as a semiconductor wafer, with a long cylindrical roll cleaning member by rotating the substrate and the roll cleaning member each in one direction while keeping the roll cleaning member in contact with the surface of the substrate in the presence of a cleaning liquid. The substrate cleaning method according to the present invention can be applied to cleaning of a surface of a semiconductor wafer, or to cleaning of a surface of a substrate in the manufacturing of an LCD (liquid crystal display) device, a PDP (plasma display panel) device, a CMOS image sensor, etc.

2. Description of the Related Art

As semiconductor devices are becoming finer these days, cleaning of various films, made of materials having different physical properties and formed on a substrate, is widely practiced. For example, in a damascene interconnect forming process for forming interconnects by filling a metal into interconnect trenches formed in an insulating film on the substrate surface, an extra metal on the substrate surface is polished away by chemical mechanical polishing (CMP) after the formation of damascene interconnects. A plurality of films such as a metal film, a barrier film and an insulating film, having different water wetting properties, are exposed on the substrate surface after CMP.

A residue of a slurry (slurry residue) that has been used in CMP, metal polishing debris and the like exist on the substrate surface having the exposed films such as a metal film, a barrier film and an insulating film by CMP. If cleaning of the substrate surface is insufficient and the residues remain on the substrate surface, the residues on the substrate surface may cause reliability problems such as the occurrence of leak from a residue portion, poor adhesion, etc. It is therefore necessary to clean the substrate surface, with a high degree of cleanliness, on which the plurality of films such as a metal film, a barrier film and an insulating film, having different water wetting properties, are exposed.

As a cleaning method for cleaning a substrate surface after CMP, there has been known a scrub cleaning method for cleaning a surface of a substrate, such as a semiconductor wafer, with a long cylindrical roll cleaning member (roll sponge or roll brush) by rotating the substrate and the roll cleaning member each in one direction while keeping the roll cleaning member in contact with the surface of the substrate in the presence of a cleaning liquid.

FIG. 1 of the accompanying drawings illustrates the manner in which a surface of a substrate is scrub-cleaned by a roll cleaning member according to the related art. As shown in FIG. 1, a roll cleaning member R has a length slightly larger than the diameter of a substrate W, and is disposed in such a position that the rotational axis $O_1$ of the roll cleaning member R is perpendicular to the rotational axis $O_2$ of the substrate W at the center of the longitudinal direction of the roll cleaning member R, and that the roll cleaning member R and the substrate W are held in contact with each other. While a cleaning liquid is supplied to the surface of the substrate W from a cleaning liquid supply nozzle N, the roll cleaning member R which is rotating about its rotational axis $O_1$ is brought into contact with the surface of the substrate W which is rotating about its rotational axis $O_2$ over the entire length in the diametrical direction of the substrate W, and the surface of the substrate W is rubbed with the roll cleaning member R in the presence of the cleaning liquid, thereby cleaning the surface of the substrate W.

The surface of the substrate W is cleaned in a cleaning area E having a length L where the surface of the substrate W and the roll cleaning member R are brought into contact with each other. The cleaning area E is divided into two areas, one on each side of the rotational axis $O_2$ of the substrate W, i.e., an inverse-direction cleaning area $E_1$ having a length $L_i$ where the substrate W and the roll cleaning member R are rotated in opposite directions at a relatively high relative rotational velocity, and a forward-direction cleaning area $E_2$ having a length $L_f$ where the substrate W and the roll cleaning member R are rotated in the same direction at a relatively low relative rotational velocity. It is desirable to supply the cleaning liquid efficiently to the cleaning area E including the inverse-direction cleaning area $E_1$ and the forward-direction cleaning area $E_2$.

As shown in FIG. 1, it is assumed that the surface of the substrate W is divided into a left area $W_L$ disposed on the left side of the cleaning area E as viewed from above and a right area $W_R$ disposed on the right side of the cleaning area E as viewed from above. When the substrate W is rotated in a clockwise direction about the rotational axis $O_2$ as viewed from above and the roll cleaning member R that is disposed over the substrate W is rotated in a clockwise direction about the rotational axis $O_1$ as viewed from its left end, the cleaning liquid supply nozzle N is generally positioned to supply the cleaning liquid to the right area $W_R$. Thus, the cleaning liquid that has been supplied to and held on the substrate W is initially supplied by rotation of the substrate W to the forward-direction cleaning area $E_2$ where the substrate W and the roll cleaning member R are rotated in the same direction. In the forward-direction cleaning area $E_2$, the moving direction of the cleaning liquid on the substrate W and the rotation direction of the roll cleaning member R are in the same direction (forward-direction). Therefore, while the roll cleaning member R rolls the cleaning liquid on the substrate W therearound, the roll cleaning member R conducts physical contact cleaning. After leaving the forward-direction cleaning area $E_2$, the cleaning liquid on the substrate W is supplied by rotation of the substrate W to the inverse-direction cleaning area $E_1$ where the roll cleaning member R conducts subsequent physical contact cleaning.

Japanese Laid-Open Patent Publication Nos. 2010-278103 and 2010-74191 disclose a scrub cleaning apparatus for performing scrub cleaning of a surface of a substrate with a roll cleaning member (roll brush or roll sponge) by rotating the substrate and the roll cleaning member while keeping the roll cleaning member in contact with the surface of the substrate in the presence of a cleaning liquid. In such a scrub cleaning apparatus, as the substrate makes one revolution on its own axis, the cleaning liquid is supplied to a forward-direction cleaning area and an inverse-direction cleaning area. Japanese Laid-Open Patent Publication Nos. 2003-77876 and 9-69502 also disclose a scrub cleaning apparatus for performing scrub cleaning of a substrate with a roll cleaning member (roll brush or roll sponge) by rotating the substrate and the roll cleaning member while keeping the roll cleaning member in contact with the surface of the substrate in the presence of a cleaning liquid. In such a scrub cleaning apparatus, the cleaning liquid is supplied to the surface of the substrate on opposite sides of the roll cleaning member.

In the forward-direction cleaning area where the relative rotational velocity between the substrate and the roll cleaning member is relatively low, only low physical cleaning capability can be obtained. In the inverse-direction cleaning area where the relative rotational velocity between the substrate and the roll cleaning member is relatively high, high physical cleaning capability can be obtained. As shown in FIG. 1, in the case where the cleaning liquid supply nozzle N is positioned at the right area $W_R$ of the substrate W, as the substrate W and the roll cleaning member R rotate, the cleaning liquid that has been supplied from the cleaning liquid supply nozzle N to and held on the substrate W is pushed by the roll cleaning member R and is discharged from the forward-direction cleaning area $E_2$ where the roll cleaning member R rotates in the same direction as the moving direction of the cleaning liquid carried by rotation of the substrate W, and is then fed smoothly into the inverse-direction cleaning area $E_1$ positioned downstream of the forward-direction cleaning area $E_2$. However, the cleaning liquid that has been discharged from the forward-direction cleaning area $E_2$ has its cleaning capability lowered because it has already been used to clean the substrate W. Further, the cleaning liquid having such lowered cleaning capability is carried by horizontal rotation of the substrate W, and reaches the inverse-direction cleaning area $E_1$ while it is discharged to the outside of the substrate W under centrifugal forces generated by rotation of the substrate W. Thus, an amount of the cleaning liquid which reaches the inverse-direction cleaning area $E_1$ decreases significantly.

Thus, it is considered that the cleaning liquid is supplied in a large amount to the inverse-direction cleaning area having high physical cleaning capability, and the cleaning liquid that has been used to clean the substrate W in the inverse-direction cleaning area is then supplied to the forward-direction cleaning area having low physical cleaning capability for cyclic usage, thereby obtaining a high comprehensive cleaning performance.

The forward-direction cleaning area includes a region wherein the relative rotational velocity between the substrate W and the roll cleaning member R is zero under certain cleaning conditions including dimensions and rotational speeds of the roll cleaning member and the substrate. In such a region and surrounding regions, the roll cleaning member is merely pressed or stamped against the substrate without relative movement therebetween. Consequently, the surface of the substrate in those regions may be contaminated back by contact with the roll cleaning member. It is required to effectively clean the surface of the substrate thus contaminated back.

Japanese Laid-Open Patent Publication No. 2010-278103 discloses a scrub cleaning apparatus for cleaning a thin substrate having a relatively large diameter. The scrub cleaning apparatus in the Japanese Laid-Open Patent Publication No. 2010-278103 is configured to prevent insufficient cleaning at a central part of the substrate from occurring due to a warp of the substrate caused by a cleaning liquid which has been supplied to the central part of the substrate and accumulated thereon while the substrate rotates at a low rotational speed. Japanese Laid-Open Patent Publication No. 2010-74191 discloses a scrub cleaning apparatus configured to judge the time for replacement of a roll cleaning member and to avoid contamination of the roll cleaning member.

In the scrub cleaning apparatus disclosed in Japanese Laid-Open Patent Publication Nos. 2010-278103 and 2010-74191, the difference between the physical cleaning capabilities of the forward-direction cleaning area and the inverse-direction cleaning area in the scrub cleaning conducted by the roll cleaning member has not been considered at all. The positions of the cleaning liquid supply nozzles shown in the drawings of Japanese Laid-Open Patent Publication Nos. 2010-278103 and 2010-74191 are considered to have been selected for convenience of illustration, and to have been accidental. Therefore, in. Japanese Laid-Open Patent Publication Nos. 2010-278103 and 2010-74191, there are no descriptions about the relationship between the position of the cleaning liquid supply nozzle and the relative rotational velocity between the substrate and the roll cleaning member.

In the scrub cleaning apparatus disclosed in Japanese Laid-Open Patent Publication Nos. 2003-77876 and 9-69502, because the cleaning liquid is supplied to the surface of the substrate on opposite sides of the roll cleaning member, the amount of cleaning liquid used is comparatively large to be uneconomical, and the apparatus configuration becomes complex. While the roll cleaning member is brought into contact with the substrate lying in the horizontal plane to clean the substrate, the cleaning liquid on the substrate is moved in a circumferential direction of the substrate and discharged therefrom under centrifugal forces generated by rotation of the substrate in the horizontal plane. However, the centrifugal forces are very small or nearly zero in the vicinity of the rotational axis of the substrate, and hence the cleaning liquid is liable to stay stagnant near the rotational axis of the substrate. Therefore, the cleaning liquid is difficult to be replaced with new one, thus lowering the cleaning capability in the vicinity of the rotational axis of the substrate.

SUMMARY OF THE INVENTION

The present invention has been made in view of the above. It is therefore an object of the present invention to provide a substrate cleaning method, for cleaning a substrate with a roll cleaning member by rotating the substrate and the roll cleaning member while keeping the roll cleaning member in contact with the substrate, which can clean the substrate highly efficiently to enhance a cleaning performance comprehensively while preventing back contamination of the substrate.

According to one aspect of the present invention, there is provided a substrate cleaning method for cleaning a substrate, comprising: rotating a roll cleaning member and a substrate respectively in one direction, the roll cleaning member extending linearly over substantially an entire length of a diameter of the substrate, and keeping the roll cleaning member in contact with the substrate in a cleaning area; and supplying a cleaning liquid to a surface of the substrate to scrub-clean the surface of the substrate in the presence of the cleaning liquid in the cleaning area; wherein the cleaning liquid is supplied initially to an inverse-direction cleaning area of the cleaning area where the relative rotational velocity between the roll cleaning member and the substrate is relatively high, and thereafter to a forward-direction cleaning area of the cleaning area where the relative rotational velocity between the roll cleaning member and the substrate is relatively low while the substrate makes one revolution on a central axis thereof. Here, "the cleaning liquid is supplied initially to an inverse-direction cleaning area" means that when the cleaning liquid is supplied to the substrate, a large portion of the cleaning liquid is supplied to the inverse-direction cleaning area, although a small portion of the cleaning liquid may be supplied to the central part of the substrate or the forward-direction cleaning area near the central part of the substrate.

According to one aspect of the present invention, the cleaning liquid is supplied in a large amount to the inverse-direction cleaning area having a high cleaning capability, and the cleaning liquid that has been used to clean the substrate in the inverse-direction cleaning area is supplied to the forward-direction cleaning area having a low physical cleaning capability for cyclic usage, thereby obtaining a high comprehensive cleaning performance. Further, the inverse-direction cleaning area is free of any region where the relative rotational velocity between the substrate and the roll cleaning member is zero. By intensively cleaning the substrate in the inverse-direction cleaning area, a possibility of back contamination of the surface of the substrate from the roll cleaning member can be greatly reduced.

A large amount of cleaning liquid is supplied to the inverse-direction cleaning area. In this case, the amount of the cleaning liquid is in the range of 0.5 to 2.0 L/min.

According to embodiments of the present invention, a supply angle of the cleaning liquid between a center line in a longitudinal direction of the inverse-direction cleaning area and a supply direction of the cleaning liquid, as projected onto the surface of the substrate, supplied to the surface of the substrate is in a range equal to or greater than 1°, and smaller than 90°, the supply angle of the cleaning liquid being defined as an angle as viewed in a clockwise direction from the center line in the longitudinal direction.

According to the embodiments of the present invention, the position of the cleaning liquid supply nozzle is determined so that the supply angle of the cleaning liquid should be within a specific range, and the cleaning liquid is supplied to the substrate from the determined position. Thus, the cleaning liquid which has been supplied to and held on the surface of the substrate is carried to the inverse-direction cleaning area, and by rotation of the roll cleaning member, the cleaning liquid is scraped out to the upstream side with respect to the rotational direction of the substrate. The scraped-out cleaning liquid is quickly discharged without being stagnant from the peripheral edge to the outside of the substrate by the cleaning liquid which has been supplied to and held on the surface of the substrate and carried to the inverse-direction cleaning area and by the centrifugal forces generated by rotation of the substrate.

According to embodiments of the present invention, the substrate cleaning method further comprises supplying a cleaning liquid to a reverse surface of the substrate in order to supply the cleaning liquid to a cleaning area of the reverse surface of the substrate where the relative rotational velocity between a roll cleaning member held in contact with the reverse surface of the substrate and the substrate is relatively high.

According to the embodiments of the present invention, the relative rotational velocity between the roll cleaning member and the substrate is increased by increasing the rotational speed of the substrate. In the case where the rotational speed of the roll cleaning member is constant, the cleaning capability can be improved by increasing the rotational speed of the substrate. For example, the rotational speed of the substrate is increased from 50 rpm to 300 rpm.

According to the embodiments of the present invention, the cleaning liquid is supplied in a large amount to the inverse-direction cleaning area having a high cleaning capability, and the cleaning liquid that has been supplied to the inverse-direction cleaning area cleans the substrate efficiently in the inverse-direction cleaning area. Then, the cleaning liquid passes through the inverse-direction cleaning area and is supplied in a necessary amount to the forward-direction cleaning area where the cleaning liquid is used for cleaning. Therefore, the cleaning performance can be enhanced comprehensively to reduce the number of defects that remain on the surface of the substrate after cleaning. Further, a possibility of back contamination of the surface of the substrate from the roll cleaning member can be greatly reduced.

BRIEF DESCRIPTION OF THE DRAWINGS

FIG. 5A is a cross-sectional view showing the substrate and the roll cleaning member in a forward-direction cleaning area together with their rotational speeds;

FIG. 5B is a cross-sectional view showing the substrate and the roll cleaning member in an inverse-direction cleaning area together with their rotational speeds;

DESCRIPTION OF THE PREFERRED EMBODIMENTS

Figure 1:
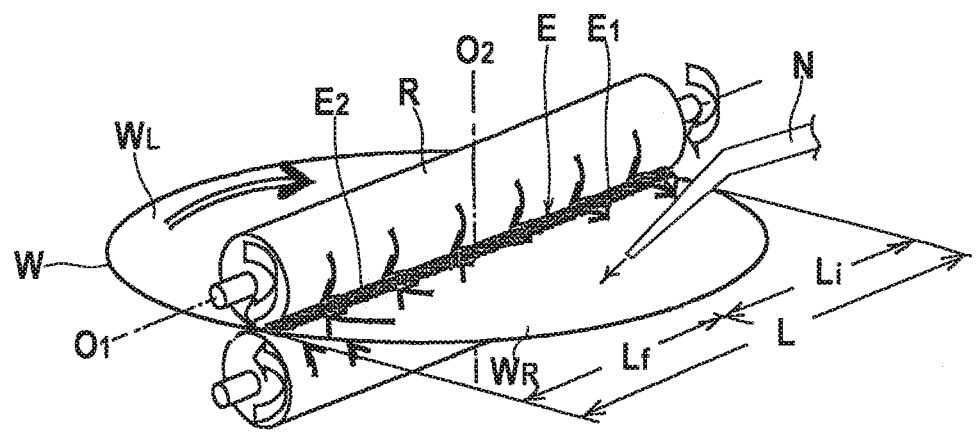
FIG. 1 is a schematic view showing the manner in which a surface of a substrate is scrub-cleaned by a roll cleaning member according to the related art.

A substrate cleaning method according to embodiments of the present invention will be described below with reference to FIGS. 2 through 5. Identical or corresponding parts are denoted by identical reference numerals throughout drawings and will not be described in duplication.

Figure 2:
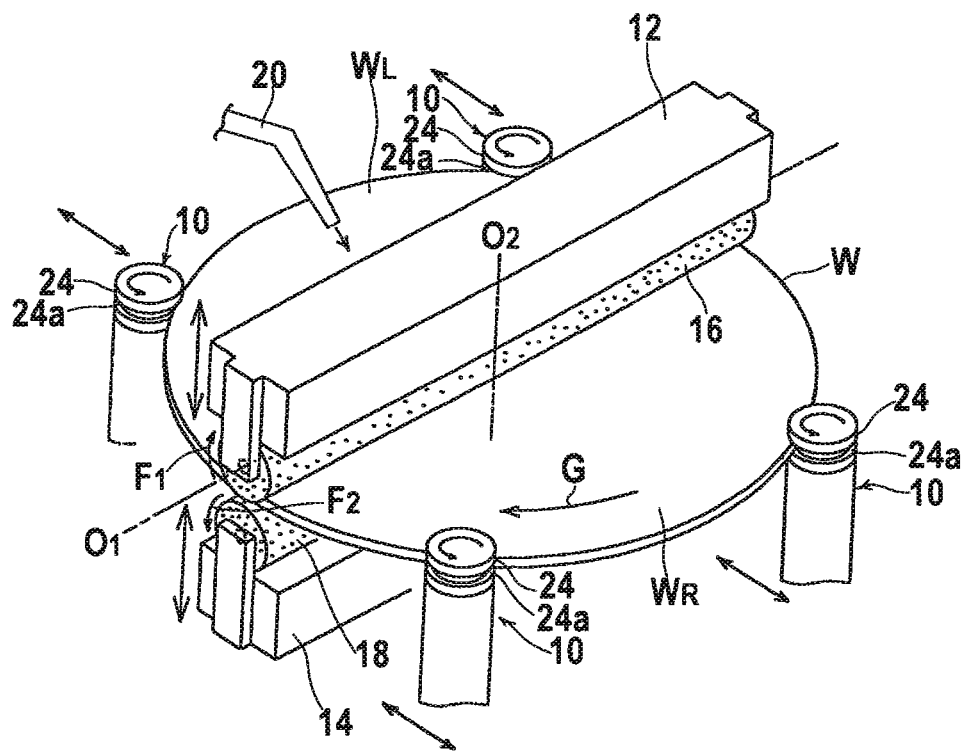
FIG. 2 is a schematic view showing a scrub cleaning apparatus for carrying out a substrate cleaning method according to an embodiment of the present invention.

FIG. 2 is a schematic view of an exemplary scrub cleaning apparatus for use in a substrate cleaning method according to the present invention. As shown in FIG. 2, the scrub cleaning apparatus includes a plurality of (e.g., four as illustrated) horizontally movable spindles 10 for supporting a periphery of a substrate W, such as a semiconductor wafer, with its front surface facing upwardly, and horizontally rotating the substrate W, a vertically movable upper roll holder 12 disposed above the substrate W supported by the spindles 10, and a vertically movable lower roll holder 14 disposed below the substrate W supported by the spindles 10.

A long cylindrical upper roll cleaning member (roll sponge) 16, e.g., made of PVA, is rotatably supported by the upper roll holder 12. A long cylindrical lower roll cleaning member (roll sponge) 18, e.g., made of PVA, is rotatably supported by the lower roll holder 14.

The upper roll holder 12 is coupled to a drive mechanism (not shown) for vertically moving the upper roll holder 12 and rotating the upper roll cleaning member 16 in the direction shown by the arrow $F_1$ (clockwise direction as viewed from its left end). The upper roll cleaning member 16 is rotatably supported by the upper roll holder 12. The lower roll holder 14 is coupled to a drive mechanism (not shown) for vertically moving the lower roll holder 14 and rotating the lower roll cleaning member 18 in the direction shown by the arrow $F_2$ (counterclockwise direction as viewed from its left end). The lower roll cleaning member 18 is rotatably supported by the lower roll holder 14.

As shown in FIG. 2, it is assumed that the surface (upper surface) of the substrate W which rotates in a clockwise direction is divided into a left area $W_L$ disposed on the left side of the upper roll cleaning member 16 as view from above and a right area $W_R$ disposed on the right side of the upper roll cleaning member 16 as viewed from above. An upper cleaning liquid supply nozzle 20, for supplying a cleaning liquid to the left area $W_L$ of the substrate W, is disposed above the substrate W supported by the spindles 10. Similarly, a lower cleaning liquid supply nozzle $20_L$ (See FIG. 3) for supplying a cleaning liquid to the reverse surface (lower surface) of the above-mentioned left area $W_L$ of the substrate W, is disposed below the substrate W supported by the spindles 10.

In the scrub cleaning apparatus having the above structure, a peripheral portion of the substrate W is located in an engagement groove 24a formed in a circumferential surface of a spinning top 24 provided at the top of each of the spindles 10. By spinning the spinning tops 24 while pressing them inwardly against the peripheral portion of the substrate W, the substrate W is rotated horizontally in the direction shown by the arrow G (clockwise direction as viewed from above). In this embodiment, two of the four spinning tops 24 apply a rotational force to the substrate W, while the other two spinning tops 24 function as a bearing for supporting the rotation of the substrate W. It is also possible to couple all the spinning tops 24 to a drive mechanism so that they all apply a rotational force to the substrate W.

While horizontally rotating the substrate W and supplying a cleaning liquid (liquid chemical) from the upper cleaning liquid supply nozzle 20 to the left area $W_L$ of the front surface (upper surface) of the substrate W, the upper roll cleaning member 16 is rotated and lowered to be brought into contact with the front surface of the rotating substrate W, thereby performing scrub cleaning of the front surface of the substrate W with the upper roll cleaning member 16 in the presence of the cleaning liquid. The length of the upper roll cleaning member 16 is set to be slightly larger than the diameter of the substrate W. The upper roll cleaning member 16 is disposed in such a position that its central axis (rotational axis) $O_1$ is substantially perpendicular to the rotational axis $O_2$ of the substrate W, and that the upper roll cleaning member 16 extends over the entire length of the diameter of the substrate W. This enables cleaning of the entire length of the substrate W in a diametrical direction, from one end to the other end of the substrate W at the same time.

Simultaneously, while supplying a cleaning liquid (liquid chemical) from the lower cleaning liquid supply nozzle $20_L$ to the left area $W_L$ of the reverse surface (lower surface) of the substrate W, the lower roll cleaning member 18 is rotated and raised to be brought into contact with the reverse surface of the rotating substrate W, thereby performing scrub cleaning of the reverse surface of the substrate W with the lower roll cleaning member 18 in the presence of the cleaning liquid. The length of the lower roll cleaning member 18 is set to be slightly larger than the diameter of the substrate W. As with the above-described cleaning of the front surface of the substrate W, cleaning of the entire length of substrate W in a diametrical direction, from one end to the other end of the reverse surface of the substrate W can be conducted at the same time.

Figure 3:
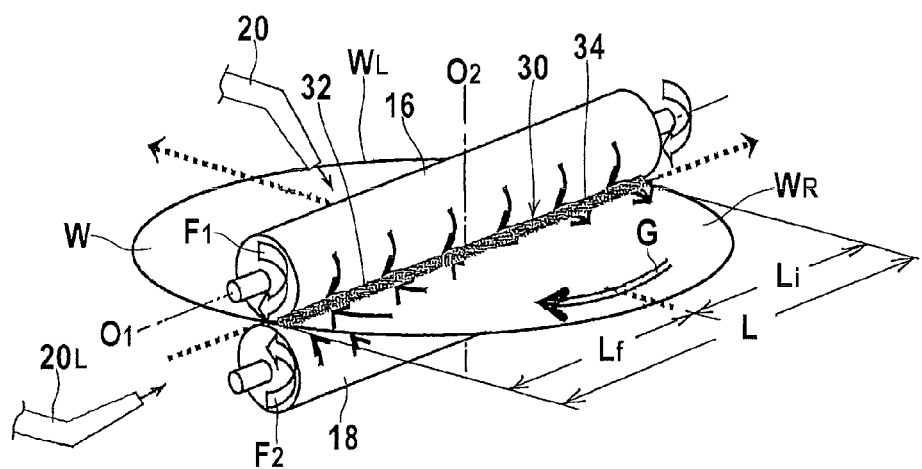
FIG. 3 is a schematic view showing the relationship between a roll cleaning member, a substrate, and a cleaning liquid supply nozzle in the scrub cleaning apparatus shown in FIG. 2.

When the front surface of the substrate W is cleaned with the upper roll cleaning member (hereinafter simply referred to as "roll cleaning member") 16 while supplying the cleaning liquid from the upper cleaning liquid supply nozzle (hereinafter simply referred to as "cleaning liquid supply nozzle") 20, the substrate W and the roll cleaning member 16 make contact with each other in a cleaning area 30 having a length L and extending linearly in the axial direction of the roll cleaning member 16 over the entire length of the substrate W in the diametrical direction of the substrate W as shown in FIG. 3. In this manner, the surface of the substrate W is scrub-cleaned in the cleaning area 30. The upper cleaning supply nozzle 20 is the general term for the nozzle used for supplying the cleaning liquid onto the substrate W, and the upper cleaning supply nozzle 20 includes a fan-shaped nozzle, a multi-port nozzle having a plurality of ports, a slit-nozzle having a slit-like opening, a plurality of single-hole nozzles, and combinations thereof. There are various supply methods of the cleaning liquid depending on the shape of the supply nozzle or the number of the supply nozzles, and any method may be selected.

Figure 4:
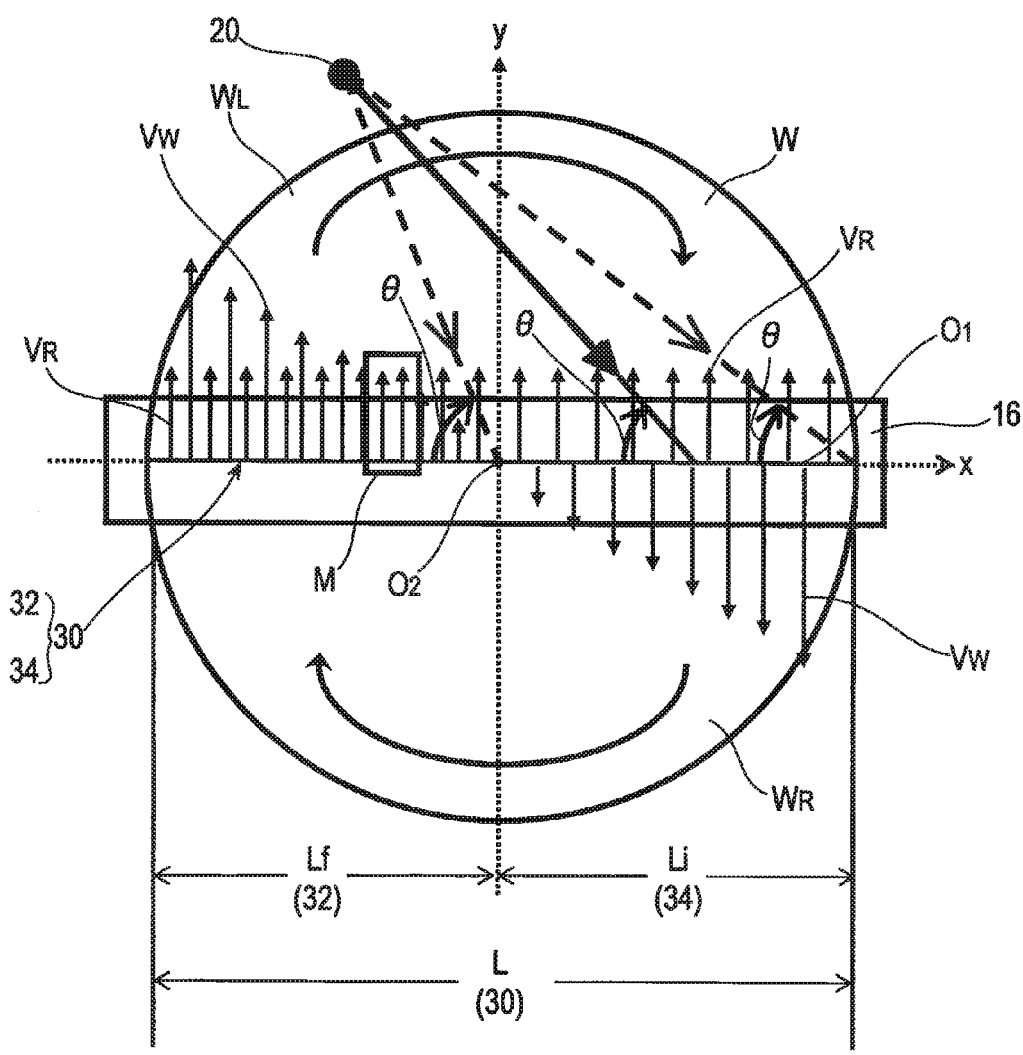
FIG. 4 is a plan view showing the relationship between the roll cleaning member, the substrate, the cleaning liquid supply nozzle, and the supply directions of the cleaning liquid from the nozzle in the scrub cleaning apparatus shown in FIG. 2.

FIG. 4 is a top plan view showing a positional relationship between the substrate and the roll cleaning member during cleaning. As shown in FIG. 4, when the substrate W rotates about its rotational axis $O_2$, the magnitude of the rotational velocity $V_W$ of the substrate W in the cleaning area 30 is zero on the rotational axis $O_2$ of the substrate W, and the direction (cleaning direction) of the rotational velocity $V_W$ of the substrate W on one side of the rotational axis $O_2$ is opposite to that on the other side of the rotational axis $O_2$. On the other hand, when the roll cleaning member 16 rotates about its rotational axis $O_1$ (see FIG. 3), the magnitude of the rotational velocity $V_R$ of the roll cleaning member 16 in the cleaning area 30 is constant over the entire length of the cleaning area 30, and the direction (cleaning direction) of the rotational velocity $V_R$ is the same on both sides of the rotational axis $O_2$ of the substrate W.

In FIG. 4, the x-axis extends along a center line of a longitudinal direction of the cleaning area 30, while the y-axis extends in a direction perpendicular to the x-axis on the surface of the substrate W. The rotational axis $O_2$ of the substrate W passes through the point of intersection between the x-axis and the y-axis.

Therefore, it is assumed that the cleaning area 30 is divided into a forward-direction cleaning area 32 having a length $L_f$ and lying on one side of the rotational axis $O_2$ of the substrate W and an inverse-direction cleaning area 34 having a length $L_i$ and lying on the opposite side of the rotational axis $O_2$ of the substrate W. In the forward-direction cleaning area 32, the direction of the rotational velocity $V_W$ of the substrate W is the same as the direction of the rotational velocity $V_R$ of the roll cleaning member 16. In the inverse-direction cleaning area 34, the direction of the rotational velocity $V_W$ of the substrate W is opposite to the direction of the rotational velocity $V_R$ of the roll cleaning member 16.

As shown in FIG. 5A, in the forward-direction cleaning area 32, the magnitude of the relative rotational velocity between the rotational velocity $V_W$ of the substrate W and the rotational velocity $V_R$ of the roll cleaning member 16 is the absolute value of the difference between the magnitudes of two rotational velocities and is relatively low, resulting in a low physical cleaning capability. Further, depending on the magnitude of the rotational velocity $V_W$ of the substrate W and the magnitude of the rotational velocity $V_R$ of the roll cleaning member 16, there may exist a region M (see FIG. 4) where the magnitude of the relative rotational velocity between the rotational velocity $V_W$ of the substrate W and the rotational velocity $V_R$ of the roll cleaning member 16 is zero ($V_W=V_R$) and the substrate W is not cleaned. It is considered that in the region M where the substrate W is not cleaned, the substrate W is merely in contact with the roll cleaning member 16, and no scrub cleaning of the surface of the substrate W with the roll cleaning member 16 is performed. Rather, it is possible that residues and the like which have adhered to the roll cleaning member 16 may be pressed against the surface of the substrate W and re-adhere to the surface of the substrate W, thus causing back contamination of the surface of the substrate W.

On the other hand, as shown in FIG. 5B, in the inverse-direction cleaning area 34, the magnitude of the relative rotational velocity between the rotational velocity $V_W$ of the substrate W and the rotational velocity $V_R$ of the roll cleaning member 16 is the sum of the magnitudes of the two rotational velocities and is relatively high, resulting in a high physical cleaning capability.

As shown in FIG. 4, an angle θ between the rotational axis $O_1$ of the roll cleaning member in the inverse-direction cleaning area 34 (see FIG. 3) extending along the x-axis and the supply direction of the cleaning liquid, as projected onto the surface of the substrate W, supplied from the cleaning liquid supply nozzle 20 to the surface of the substrate W is preferably in a range equal to or greater than 1°, and smaller than 90°, the angle θ being referred to as a cleaning liquid supply angle. In FIG. 4, the cleaning liquid supply angle θ is defined as an angle as viewed in a clockwise direction from the rotational axis $O_1$ of the roll cleaning member.

It is necessary that the cleaning liquid supply angle is selected from the point that a large amount of cleaning liquid should be supplied to the inverse-direction cleaning area 34 and the direction in which the cleaning liquid is discharged from the substrate. Therefore, even if the cleaning liquid supply direction is directed toward any location of the inverse-direction cleaning area 34 having the length (longitudinal direction) Li which is substantially equal to the radius of the substrate W, the cleaning liquid supply angle θ is preferably in a range equal to or greater than 1°, and smaller than 90°. More preferably, the cleaning liquid supply angle θ is in a range equal to or greater than 30°, and smaller than 80°.

Next, the case where the cleaning liquid supply nozzle 20 comprises a single-hole nozzle will be considered. In the case where the cleaning liquid supply angle θ is 0°, the cleaning liquid supply nozzle 20 is located above the x-axis, and the cleaning liquid supply direction overlaps with the rotational axis $O_1$. Thus, the cleaning liquid cannot be supplied to the inverse-direction cleaning area 34.

In order to supply a large amount of cleaning liquid initially to the inverse-direction cleaning area 34 by supplying the cleaning liquid onto the surface of the substrate W which rotates in a clockwise direction, it is necessary that the cleaning liquid supply nozzle 20 should be on the upper side of the x-axis in FIG. 4. However, in the case where the cleaning liquid supply nozzle 20 is located above the y-axis, or on the right side of the y-axis and on the upper side of the x-axis in FIG. 4, the cleaning liquid supply angle may be not less than 90°. For example, there is a case where the cleaning liquid is supplied from the cleaning liquid supply nozzle 20 toward the central part of the substrate W in the inverse-direction cleaning area 34. In this case, the cleaning liquid is supplied from the cleaning liquid supply nozzle 20 to the direction opposite to the rotational direction of the substrate W, and the cleaning liquid is supplied to the central part of the substrate W. This case is undesirable from the standpoint of discharging the cleaning liquid, from the surface of the substrate, which has cleaned and removed the contaminants.

By selecting the range of the cleaning liquid supply angle suitably, the position of the cleaning liquid supply nozzle 20 can be determined even if any shape of nozzle or any number of nozzles are used. In this manner, by specifying the cleaning liquid supply angle and supplying the cleaning liquid to the substrate W, the cleaning liquid which has been supplied to and held on the surface of the substrate W is carried to the inverse-direction cleaning area 34 to clean the surface of the substrate, and by rotation of the roll cleaning member 16, part of the cleaning liquid which has been used for cleaning is scraped out to the upstream side with respect to the rotational direction of the substrate. The scraped-out cleaning liquid is quickly discharged without being stagnant from the peripheral edge to the outside of the substrate W by the cleaning liquid which has been subsequently supplied to and held on the surface of the substrate W and carried to the inverse-direction cleaning area 34 and by the centrifugal forces generated by rotation of the substrate W.

The substrate cleaning method according to the present invention is carried out using the scrub cleaning apparatus shown in FIG. 2 to scrub-clean the surface of the substrate W by bringing the roll cleaning member 16 into contact with the surface of the substrate W while the roll cleaning member 16 is rotated and the substrate is rotated in the horizontal plane by the spindles 10. When the surface of the substrate W is thus scrub-cleaned, the cleaning liquid is supplied to the surface of the substrate W from the cleaning liquid supply nozzle 20.

As described above, the forward-direction cleaning area 32 having the length $L_f$ has a low physical cleaning capability, whereas the inverse-direction cleaning area 34 having the length $L_i$ has a high physical cleaning capability. As the substrate W makes one revolution, the cleaning liquid supplied from the cleaning liquid supply nozzle 20 to the surface of the substrate W is initially supplied to the inverse-direction cleaning area 34 having the high physical cleaning capability to clean the substrate W in the inverse-direction cleaning area 34, and is then supplied to the forward-direction cleaning area 32 having the low physical cleaning capability for cyclic usage.

In the inverse-direction cleaning area 34, the roll cleaning member 16 rotates in a direction opposite to the direction in which the cleaning liquid is carried by rotation of the substrate W. The cleaning liquid supplied to the surface of the substrate W passes through the inverse-direction cleaning area 34 by rotation of the substrate W and is then supplied to the forward-direction cleaning area 32. Therefore, the cleaning liquid does not run short in the forward-direction cleaning area 32.

The inverse-direction cleaning area 34 having the high physical cleaning capability is supplied with a large amount of cleaning liquid. Therefore, even if the cleaning liquid supplied to the forward-direction cleaning area 32 runs short, a high comprehensive cleaning capability can be obtained. Further, the inverse-direction cleaning area 34 is free of any region where the relative rotational velocity between the substrate W and the roll cleaning member 16 is zero. By intensively cleaning the substrate W in the inverse-direction cleaning area 34, a possibility of back contamination of the surface of the substrate W from the roll cleaning member 16 can be greatly reduced.

As described above, the cleaning liquid supply angle θ (angle as viewed in a clockwise direction from the rotational axis $O_1$) between the rotational axis $O_1$ of the cleaning member in the inverse-direction cleaning area 34 extending along the x-axis and the supply direction of the cleaning liquid, as projected onto the surface of the substrate W, supplied from the cleaning liquid supply nozzle 20 to the surface of the substrate W is in a range equal to or greater than 1°, and smaller than 90°. Thus, the cleaning liquid which has been supplied to and held on the surface of the substrate W is carried to the inverse-direction cleaning area 34, and by rotation of the roll cleaning member 16, the cleaning liquid is scraped out to the upstream side with respect to the rotational direction of the substrate. The scraped-out cleaning liquid is quickly discharged without being stagnant from the peripheral edge to the outside of the substrate W by the cleaning liquid which has been subsequently supplied to and held on the surface of the substrate W and carried to the inverse-direction cleaning area 34 and by the centrifugal forces generated by rotation of the substrate W.

The CMP process is generally performed on a surface of a substrate whose reverse surface is kept in contact with and attracted under suction to a substrate holder. Therefore, after the substrate is polished by the CMP process, the reverse surface of the substrate is usually contaminated and needs to be cleaned to a high degree of cleanliness in a subsequent cleaning process. The cleaning liquid which has been supplied and attached to the reverse surface of the substrate held horizontally tends to drop off the substrate by gravity. Consequently, the cleaning liquid is more difficult to stay on the reverse surface of the substrate than on the surface of the substrate. In other words, if the cleaning liquid is supplied to the reverse surface of the substrate at the same rate as the cleaning liquid supplied to the surface of the substrate, then the amount of cleaning liquid that is supplied to a cleaning area having a high cleaning capability on the reverse surface of the substrate is smaller than the amount of cleaning liquid that is supplied to a cleaning area having a high cleaning capability on the surface of the substrate, resulting in a lower cleaning capability for the reverse surface of the substrate. However, the cleaning method which is essentially the same as the cleaning method for the surface of the substrate as described above may be applied to the reverse surface of the substrate. Specifically, as shown in FIG. 3, the cleaning liquid is supplied to the reverse surface of the substrate W in order to supply the cleaning liquid to a cleaning area where the relative rotational velocity between the roll cleaning member 18 held in contact with the reverse surface of the substrate W and the substrate W is relatively high. Therefore, the period of time when the cleaning liquid supplied to the reverse surface of the substrate W reaches the cleaning area where the relative rotational velocity between the roll cleaning member 18 and the substrate W is relatively high can be minimized to reduce the amount of cleaning liquid which drops by its own weight from the reverse surface of the substrate W. Thus, the reverse surface of the substrate W can be cleaned as effectively as the surface of the substrate W.

Figure 6:
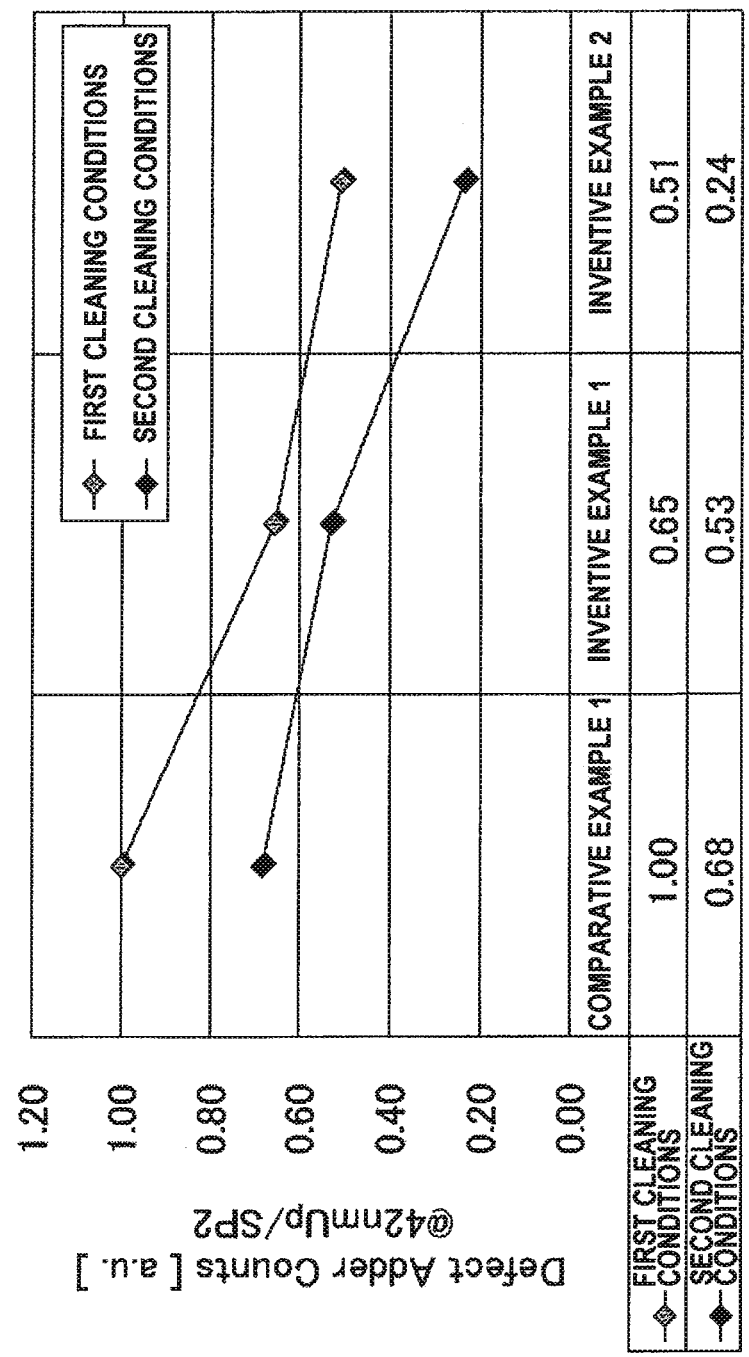
FIG. 6 is a graph showing results of measuring the number of defects that remained on the surfaces of substrates after cleaning in Inventive Examples 1, 2 and Comparative Example 1.

FIG. 6 shows results of measuring the number of defects that remained on the surfaces of substrates after they were cleaned in Inventive Examples 1, 2 and Comparative Example 1. The scrub cleaning apparatus shown in FIG. 2 was used. In Inventive Example 1, the surface of the substrate was cleaned under first cleaning conditions and second cleaning conditions while the left area $W_L$ (see FIG. 2) of the substrate was being supplied with a cleaning liquid at a first rate, and dried, and then the number of defects having sizes equal to or greater than 42 nm, which remained on the surface of the substrate, was measured. In Inventive Example 2, the surface of the substrate was cleaned under the first cleaning conditions and the second cleaning conditions while the left area $W_L$ (see FIG. 2) of the substrate was being supplied with a cleaning liquid at a second rate higher than the first rate, and dried, and then the number of defects having sizes equal to or greater than 42 nm, which remained on the surface of the substrate, was measured. In Comparative Example 1, the surface of substrate was cleaned under the first cleaning conditions and the second cleaning conditions while the right area $W_R$ (see FIG. 2) of the substrate was being supplied with a cleaning liquid at the first rate, and dried, and then the number of defects having sizes equal to or greater than 42 nm, which remained on the surface of the substrate, was measured. The substrate surface was dried by spin rinse dry. The number of defects was measured using wafer inspection tool SP2 manufactured by KLA-Tencor. Wafer inspection tool SP2 was also used to measure the number of defects in subsequent Inventive and Comparative Examples.

The vertical axis of FIG. 6 represents the relative ratio of the number of defects when the surfaces of the substrates were cleaned under the respective conditions to the number of defects which was 1.0 in Comparative Example 1 conducted under the first cleaning conditions.

In Inventive Examples 1, 2, bare silicon substrates whose surfaces were cleaned by DHF (dilute hydrofluoric acid) and then cleaned by $O_3$ to produce oxide films on their outermost surfaces were used without being subjected to a polishing process as substrates to be cleaned. The surfaces of the bare silicon substrates are hydrophilic as represented by a contact angle ranging from about 1° to 3° measured on the surfaces using ultrapure water. The first cleaning conditions are conditions to achieve a low cleaning capability by rotating the bare silicon substrates at a rotational speed of 50 rpm and rotating the roll cleaning member at a rotational speed of 200 rpm. The second cleaning conditions are conditions to achieve a high cleaning capability by rotating the bare silicon substrates at a rotational speed of 150 rpm and rotating the roll cleaning member at a rotational speed of 200 rpm.

As shown in FIG. 6, the number of defects that remained on the surfaces of the substrates in Inventive Examples 1, 2 conducted under the first cleaning conditions is much smaller, e.g., 65% through 51% smaller, than the number of defects that remained on the surface of the substrate in Comparative Example 1. The number of defects that remained on the surfaces of the substrates in Inventive Examples 1, 2 conducted under the second cleaning conditions for a higher cleaning capability is much smaller, e.g., 53% through 24% smaller, than the number of defects that remained on the surface of the substrate in Comparative Example 1. Particularly, a comparison between the first cleaning conditions and the second cleaning conditions indicates that a higher cleaning effect can be achieved by increasing the rotational speed of the substrate to increase the relative rotational velocity between the roll cleaning member and the substrate. A review of Inventive Examples 1, 2 shows that a much higher cleaning effect can be achieved by increasing the amount of cleaning liquid supplied to the left area $W_L$ of the substrate shown in FIG. 2. It can be seen from FIG. 6 that the number of defects remaining on the surface of the substrate can be reduced to as low as 24%.

Figure 7:
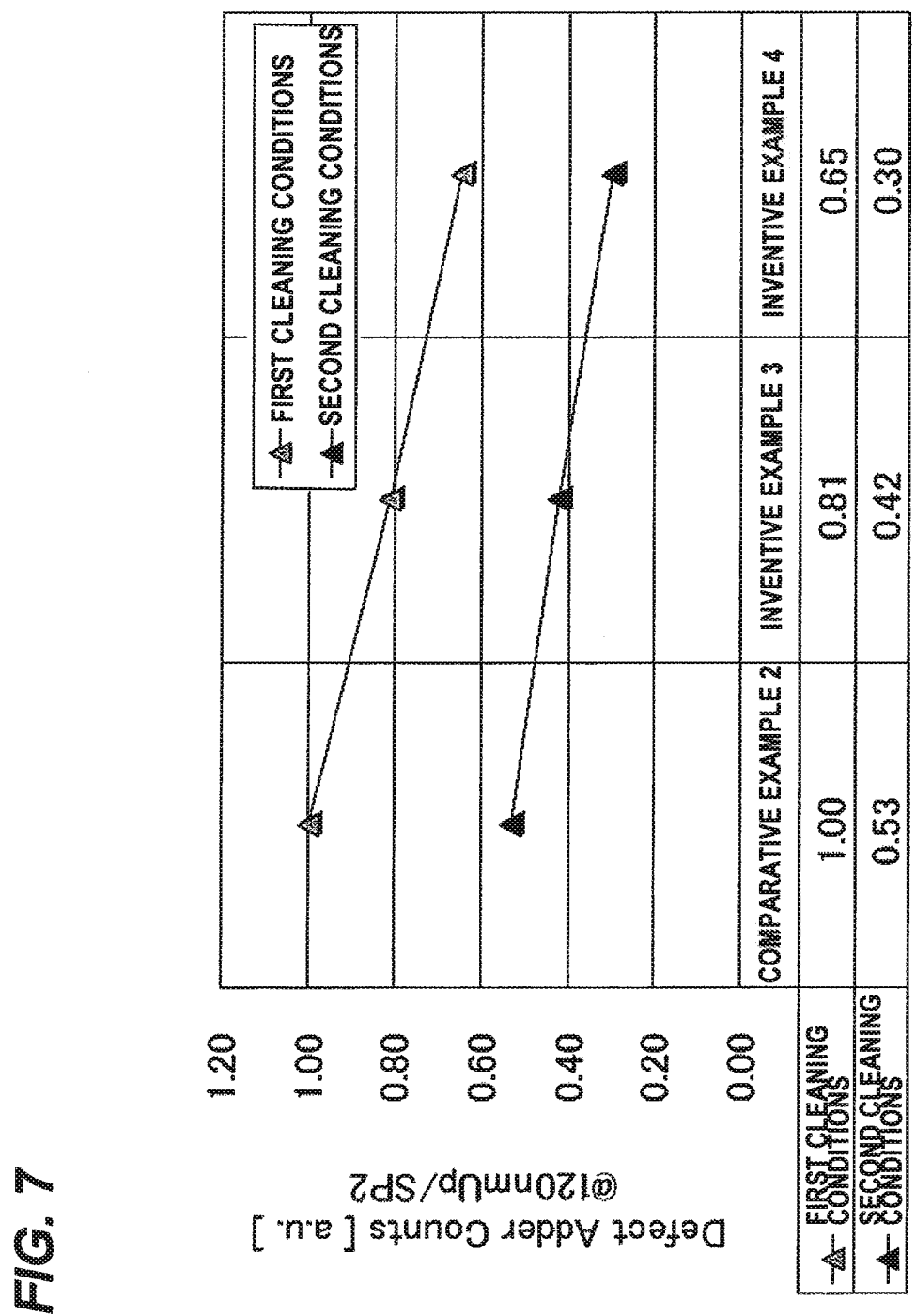
FIG. 7 is a graph showing results of measuring the number of defects that remained on the surfaces of substrates after cleaning in Inventive Examples 3, 4 and Comparative Example 2.

FIG. 7 shows results of measuring the number of defects that remained on the surfaces of substrates after they were cleaned in Inventive Examples 3, 4 and Comparative Example 2. In inventive Examples 3, 4, substrates with a Low-k film (BD2x, k=2.4) deposited on their surfaces were polished by a CMP apparatus, and then their surfaces were cleaned under the same conditions as with Inventive Examples 1, 2 and dried with IPA (Iso-Propyl Alcohol). Then, the number of defects having sizes equal to or greater than 120 nm, which remained on the surface of the substrate, was measured. In Comparative Example 2, the surface of the substrate was cleaned under the first cleaning conditions and the second cleaning conditions while the right area $W_R$ (see FIG. 2) of the substrate was being supplied with a cleaning liquid at the first rate, and dried with IPA. Then, the number of defects having sizes equal to or greater than 120 nm, which remained on the surface of the substrate, was measured. The surfaces of the substrates are hydrophobic as represented by a contact angle ranging from about 40° to 60° measured on the surfaces using ultrapure water.

The vertical axis of FIG. 7 represents the relative ratio of the number of defects when the surfaces of the substrates were cleaned under the respective conditions to the number of defects which was 1.0 in Comparative Example 1 conducted under the first cleaning conditions.

As shown in FIG. 7, the number of defects that remained on the surfaces of the substrates in Inventive Examples 3, 4 conducted under the first cleaning conditions is much smaller, e.g., 81% through 65% smaller, than the number of defects that remained on the surface of the substrate in Comparative Example 2. The number of defects that remained on the surfaces of the substrates in Inventive Examples 3, 4 conducted under the second cleaning conditions for a higher cleaning capability is much smaller, e.g., 42% through 30% smaller, than the number of defects that remained on the surface of the substrate in Comparative Example 2. Particularly, a comparison between the first cleaning conditions and the second cleaning conditions indicates that regardless of the cleaning capability, the present invention is effective to reduce the number of defects that remain on the surface of the substrate after cleaning. Specifically, the present invention is effective to improve the cleaning capability of a physical cleaning process for cleaning the substrate with the roll cleaning member that is held in physical contact with the substrate while the substrate and the roll cleaning member are being rotated. A review of Inventive Examples 3, 4 shows that a much higher cleaning effect can be achieved by increasing an amount of the cleaning liquid supplied to the left area $W_L$ of the substrate shown in FIG. 2. It can be seen from FIG. 7 that the number of defects remaining on the substrate can be reduced to as low as 30%.

Although preferred embodiments have been described in detail above, it should be understood that the present invention is not limited to the illustrated embodiments, but many changes and modifications can be made therein without departing from the appended claims.

What is claimed is:

1. A substrate cleaning method for cleaning a substrate, comprising:
supporting the substrate by a substrate supporting device;
rotating the substrate in one direction by the substrate supporting device;
rotating a roll cleaning member in one direction, the roll cleaning member extending linearly over substantially an entire length of a diameter of the substrate, and keeping the roll cleaning member in contact with a front surface of the substrate in a cleaning area to scrub-clean the front surface of the substrate; and
supplying a cleaning liquid from a cleaning liquid supply nozzle to a first cleaning area of the front surface of the substrate at a predetermined angle θ of a cleaning liquid supply angle, while the roll cleaning member is scrub-cleaning the front surface of the substrate;
wherein the first cleaning area is part of the cleaning area in which the front surface of the substrate and the roll cleaning member are held in contact with each other;
the direction of a rotational speed of the substrate is opposite to the direction of a rotational speed of the roll cleaning member in the first cleaning area; and
the predetermined angle θ is an angle between a rotational axis of the roll cleaning member and a supply direction of the cleaning liquid, the rotational axis of the roll cleaning member and the supply direction of the cleaning liquid being projected onto the front surface of the substrate, the angle θ being defined as an angle as viewed in a clockwise direction from the rotational axis of the roll cleaning member.

2. The substrate cleaning method according to claim 1, wherein the predetermined angle θ is in a range equal to or greater than 1°, and smaller than 90°.

3. The substrate cleaning method according to claim 1, further comprising:
rotating a lower roll cleaning member in one direction, the lower roll cleaning member extending linearly over substantially an entire length of a diameter of the substrate, and keeping the lower roll cleaning member in contact with a reverse surface of the substrate in a cleaning area to scrub-clean the reverse surface of the substrate; and
supplying a cleaning liquid from a lower cleaning liquid supply nozzle to the cleaning area of the reverse surface of the substrate in order to supply the cleaning liquid to the cleaning area of the reverse surface of the substrate where the direction of a rotational speed of the substrate is opposite to the direction of a rotational speed of the lower roll cleaning member in the cleaning area.

4. The substrate cleaning method according to claim 1, wherein the rotational speed of the substrate is increased to enhance a cleaning capability.

* * * * *